(12) United States Patent
Cho et al.

(10) Patent No.: US 9,147,856 B2
(45) Date of Patent: Sep. 29, 2015

(54) ORGANIC LIGHT EMITTING DEVICE

(71) Applicant: Electronics and Telecommunications Research Institute, Daejeon (KR)

(72) Inventors: Doo-Hee Cho, Daejeon (KR); Jin Wook Shin, Incheon (KR); Jeong Ik Lee, Gyeonggi-do (KR); Hye Yong Chu, Daejeon (KR); Jun-Han Han, Daejeon (KR); Joo Hyun Hwang, Seoul (KR); Seung Koo Park, Daejeon (KR); Jaehyun Moon, Daejeon (KR); Nam Sung Cho, Daejeon (KR); Jin Woo Huh, Daejeon (KR); Chul Woong Joo, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 218 days.

(21) Appl. No.: 13/709,847

(22) Filed: Dec. 10, 2012

(65) Prior Publication Data

US 2013/0181195 A1    Jul. 18, 2013

(30) Foreign Application Priority Data

Jan. 18, 2012    (KR) .................. 10-2012-0005620

(51) Int. Cl.
*H01L 29/08* (2006.01)
*H01L 51/52* (2006.01)

(52) U.S. Cl.
CPC ........ *H01L 51/5203* (2013.01); *H01L 51/5268* (2013.01)

(58) Field of Classification Search
CPC ... H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

2001/0050532 A1* 12/2001 Eida et al. ............... 313/504
2004/0183433 A1   9/2004 Cho et al.

(Continued)

FOREIGN PATENT DOCUMENTS

JP    2008-066027 A    3/2008
JP    2010-176928 A    8/2010
KR    10-0563046 B1    3/2006

(Continued)

OTHER PUBLICATIONS

G. Gu et al., "High-external-quantum-efficiency organic light-emitting devices", Optics Letters, Mar. 15, 1997, pp. 396-398, vol. 22, No. 6.

*Primary Examiner* — David Vu
*Assistant Examiner* — Cuong Nguyen
(74) *Attorney, Agent, or Firm* — Rabin & Berdo, P.C.

(57) ABSTRACT

An organic light emitting device is provided that includes a substrate; an embossing layer provided on the substrate; a planarization layer provided on the embossing layer; a first electrode provided on the planarization layer; an organic light emitting layer provided on the first electrode; and a second electrode provided on the organic light emitting layer. The planarization layer may include a first planarization layer provided on the embossing layer; and a second planarization layer provided on the first planarization layer. The embossing layer may have a refractive index ranging from about 1.3 to about 1.5. The planarization layer may include a first planarization layer having a surface roughness of about 10 nm to about 50 nm and a refractive index that ranges from about 1.8 to about 2.5; and a second planarization layer provided on the first planarization layer and having a surface roughness of less than about 10 nm.

12 Claims, 6 Drawing Sheets

(56) References Cited

U.S. PATENT DOCUMENTS

| | | | |
|---|---|---|---|
| 2008/0012074 A1* | 1/2008 | Braymer et al. | 257/347 |
| 2010/0110551 A1* | 5/2010 | Lamansky et al. | 359/599 |
| 2011/0114931 A1* | 5/2011 | Lee et al. | 257/40 |
| 2012/0241771 A1* | 9/2012 | Kato et al. | 257/88 |
| 2012/0286258 A1* | 11/2012 | Naraoka et al. | 257/40 |

FOREIGN PATENT DOCUMENTS

| | | |
|---|---|---|
| KR | 10-2011-0079911 | 7/2011 |
| KR | 10-1081499 B1 | 11/2011 |

* cited by examiner

ORGANIC LIGHT EMITTING DEVICE

CROSS-REFERENCE TO RELATED APPLICATIONS

This U.S. non-provisional patent application claims priority under 35 U.S.C. §119 of Korean Patent Application No. 10-2012-0005620, filed on Jan. 18, 2012, the entire contents of which are hereby incorporated by reference.

BACKGROUND OF THE INVENTION

The present invention disclosed herein relates to an organic light emitting device, and more particularly, to an organic light emitting device having high light extraction efficiency, lowering leakage current, and improving reliability.

An organic light emitting device, for example, an organic light emitting diode is a light emitting device, where excitons occur when holes supplied from an anode electrode and electrons supplied from a cathode electrode are combined in an organic light emitting layer therebetween and they are recombined again. The organic light emitting diode as a self-light-emitting device is applied to a display device and developed due to its wide viewing angle, fast response speed, and high color reproduction range. Furthermore, recent research and development on applying an organic light emitting diode are actively in progress. The organic light emitting diode may be configured to emit R (red), G (green), and B (blue) separately, or to emit white color.

According to Thompson, external quantum efficiency that represents the luminous efficiency of an organic light emitting device may be represented with the multiplication of the internal quantum efficiency and light extraction efficiency of a device, and may not exceed about 20% because the light emitted from an organic light emitting layer may not be emitted to a substrate external due to total reflection at the interface between layers having a different refractive index and accordingly thereto may be trapped in each layer inside (Optics Letters 22, 6, 396, 1997). That is, the external quantum efficiency of an organic light emitting device does not surpass about 20%. The light trapped in a layer of an organic light emitting diode is called guided mode light, and the light emitted to external air, passing through the interface of each layer, is called an out-coupling mode light. In a plane light source having a panel shape, converting a guided mode light into an out-coupling mode light is called light extraction.

In order to improve light extraction efficiency, materials, which have the same or higher refractive index as it approaches from an organic light emitting device toward a light emitting direction, may be stacked. However, since a transparent substrate used for organic light emitting devices, for example, a glass substrate, has a low refractive index of about 1.5, some limitations in the light extraction may occur.

FIG. 1 is a schematic view illustrating a layer stacked structure of a typical organic light emitting diode. The organic light emitting diode includes a sequentially stacked substrate 10, anode (i.e. a transparent electrode) 20, organic light emitting layer 30, cathode (i.e. a reflective electrode) 40, and protective layer 50.

In the typical organic light emitting diode, among light generated from the organic light emitting layer 30, the light emitted toward a cathode direction is mostly reflected so that it is emitted toward an anode direction. As a result, most of the generated light is emitted toward the anode side. At this point, in an organic light emitting diode having an anode on a substrate, in order to emit light, a transparent substrate such as a glass substrate is used. When light passes through an organic light emitting layer, an anode, and substrate to be emitted to air, due to a refractive index difference of each layer, a reflective light ① between an organic light emitting layer and an anode layer, a reflective light ② between an anode layer and a substrate, and a reflective light ③ between the substrate and air occur. Especially, by Snell's law below (i.e. Equation 1), lights incident into the interface from a high refractive index medium into a low refractive index medium at an angle grater than a critical angle perpendicular to a substrate surface are all reflected so that they are not emitted to an external and extinct in a device internal.

$$\frac{n_1}{n_2} = \frac{\sin a_2}{\sin a_1} \quad \text{[Equation 1]}$$

where $n_1$ is a refractive index of a material before incident, $n_2$ is a refractive index of a material after incident, $a_1$ is an incident angle with respect to the normal of an incident surface, and $a_2$ is a refraction angle with respect to the normal of an incident surface.

A refractive index of an organic light emitting layer in an organic light emitting diode may vary according to wavelengths of light and generally ranges from about 1.6 to about 1.9 in visible range. Since a refractive index of Indium Tin Oxide (ITO) typically used as an anode ranges from about 1.9 to about 2.0, almost no total reflection between an organic light emitting layer and an anode occurs, so that no specific issue is raised. However, when the refractive index of a glass or plastic transparent substrate is about 1.5 and an organic light emitting layer and an anode layer of an organic light emitting diode has a very thin thickness of about 100 nm to about 400 nm, most of light generated from the organic light emitting layer becomes in a guided mode, thereby not being emitted to a device outside. The reason is that most of light generated from the organic light emitting layer is not emitted perpendicular to a substrate surface, and is incident to a substrate having a low refractive index at an angle almost parallel to the substrate surface. Therefore, in a typical organic light emitting diode, a ratio of light ④ emitted to the outside of a glass substrate is very small, i.e. about 20% of the total amount of light emitted.

As known from Equation 1, if the refractive indices of materials at both sides of an interface are the same, an incident angle becomes identical to a refraction angle, so that no total reflection occurs. That is, when the refractive indices of an organic light emitting layer and an anode are identical or similar to the refractive index of a substrate, guided mode is minimized at the interface between the substrate and the anode. As a result, light extraction efficiency is increased, and power efficiency of an organic light emitting diode is increased also.

However, since the refractive index of ITO typically used as an anode is between about 1.9 to about 2.0, it is very difficult to find a substrate material having the same refractive index as an anode. Furthermore, since an organic light emitting diode emits light in an anode direction, a substrate material is required to have a very high transmittance in a visible region. However, a transparent substrate material having a refractive index of about 1.9 to about 2.0 and adequate strength and surface flatness as a substrate is very rare. Even if there is such a substrate material, it is very hard to manufacture a thin and flat large-sized glass by using the substrate material.

Accordingly, in order to manufacture a highly-efficient organic light emitting device, a method of improving light extraction efficiency needs to be provided and limitations derived from the above method need to be resolved.

SUMMARY OF THE INVENTION

The present invention provides an organic light emitting device having high light extraction efficiency, lowering leakage current, and improving reliability.

Embodiments of the present invention provide organic light emitting devices including: a first electrode on a substrate, a second electrode on the first electrode, an organic light emitting layer between the first electrode and the second electrode, an embossing layer between the first electrode and the substrate; and a planarization layer between the first electrode and the embossing layer.

A refractive index of the planarization layer may be the same or becomes lower as it is progressively farther from the embossing layer.

A refractive index of the planarization layer may range from about 1.8 to about 2.5.

The planarization layer may include: a first planarization layer on the embossing layer and having a surface roughness of about 10 nm to about 50 nm; and a second planarization layer on the first planarization layer and having a surface roughness of less than about 10 nm.

The first planarization layer may have a refractive index of about 1.8 to about 2.5.

The first planarization layer may include at least one of metal oxide, metal sulfide, or metal nitride.

The metal oxide may include at least one of $TiO_2$, ZnO, $SnO_2$, $In_2O_3$, and $In_2O_3$—$SnO_2$; the metal sulfide may include ZnS; and the metal nitride may include silicon nitride.

The second planarization layer may include a polycrystalline material or an amorphous material, whose average size of particles is less than about 10 nm.

The second planarization layer may include at least one of metal oxide, metal sulfide, metal nitride, organic/inorganic hybrid material, or a nano composite.

The organic/inorganic hybrid material may include a mixture of the metal oxide and at least one of polyvinyl phenol resin, epoxy resin, polyimide resin, poly-styrene resin, polycarbonate resin, polyethylene resin, PMMA resin, polypropylene resin, and silicon resin as organic matter.

The metal oxide may include at least one of $TiO_2$, ZnO, $SnO_2$, $In_2O_3$, and $In_2O_3$—$SnO_2$; the metal sulfide may include ZnS; and the metal nitride may include silicon nitride.

The embossing layer may include at least one of polyimide, epoxy, polycarbonate, PVC, PVP, polyethylene, polyacrylamide, or perylene, each having a refractive index of about 1.3 to about 1.5.

The first electrode has a refractive index of about 1.9 to about 2.0.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
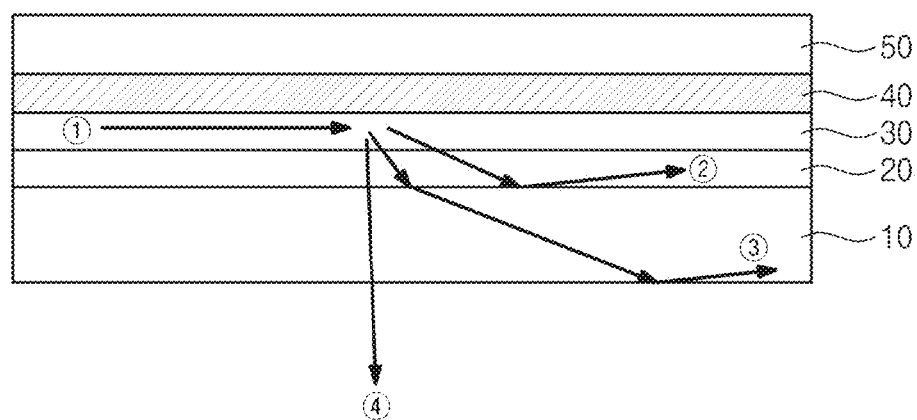
FIG. 1 is a schematic view illustrating a layer stacked structure of a typical organic light emitting diode.
Figure 2:
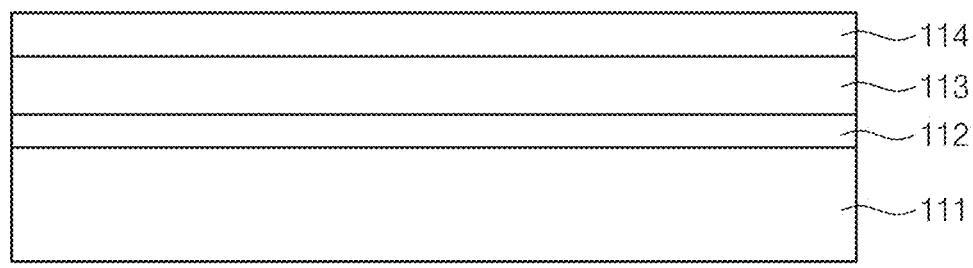
FIG. 2 is a schematic view illustrating an organic light emitting diode according to an embodiment of the present invention.

FIG. 2 is a schematic view illustrating an organic light emitting device according to an embodiment of the present invention.

The organic light emitting device of FIG. 2 includes a substrate 111, a first electrode 112, an organic light emitting layer 113, and a second electrode 114, which are sequentially stacked.

The substrate 111 provides a mechanical strength to the organic light emitting device and also serves as a transparent window. The substrate 111 may be formed of glass or plastic having light transmitting property. In the case of plastic, polyethylene terephthalate (PET), polycarbonate (PC), and poly ethersulfone (PES), polyimide (PI) may be used.

The first electrode 112 may be an anode or a cathode. For convenience of description, it is assumed hereinafter that the first electrode 112 is an anode and a transparent electrode of ITO.

The second electrode 114 has a polarity that is paired with the first electrode 112. For example, if the first electrode 112 is an anode, the second electrode 114 is a cathode, and if the first electrode 112 is a cathode, the second electrode 114 is an anode.

The organic light emitting layer 113 is an element which includes organic matter and generates light by using the power provided from the first electrode 112 and the second electrode 114. For example, an Organic Light Emitting Diode (OLED) is a self-light-emitting type device that generates a light of a specific wavelength as electrons and holes are recombined in the organic light emitting layer 113 in order to emit energy when electric filed is applied. A basic structure of the OLED includes an anode (i.e. an ITO layer), a hole injection layer, a hole transfer layer, a light emitting layer, an electron transfer layer, an electro injection layer, and a cathode (i.e. a metal electrode), which are in the order close to the substrate 111. Hereinafter, a layer between the both electrodes 112 and 114 (more specifically, i.e. a hole injection layer, a hole transfer layer, a light emitting layer, an electron transfer layer, and an electron injection layer) is designated as an organic light emitting layer.

The organic light emitting layer is a key element for lighting source. Based on a device structure, there may be a stack structure, a single light emitting layer structure, a horizontal RGB structure, and a down conversion structure. Among them, the stack structure is typically used because it is easily manufactured and high efficiency is obtained. Additionally, according to a material used, there may be fluorescence, phosphorescence, and hybrid white OLED. If fluorescence is used, device stability may be excellent but high efficiency may be hardly obtained. Also, if phosphorescence is used, high efficiency may be obtained but stable blue color may be hardly obtained. As efforts to complement two materials' issues, research on a hybrid method, which uses fluorescence as blue color and uses phosphorescence as other colors, is being actively in progress.

Figure 3:
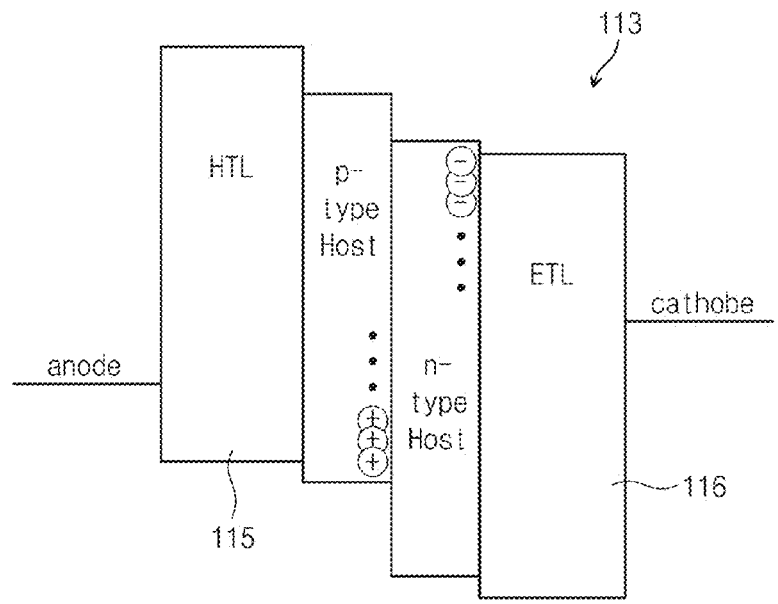
FIG. 3 is a schematic view illustrating a structure of a phosphorescent white OLED device including a light emitting layer of a double layer.

As shown in FIG. 3, which illustrates a structure of a phosphorescent white OLED device, a structure of a phosphorescence device includes a two-layer light emitting layer 113 as a basic frame, in addition to a hole injection/transfer layer 115 and an electron injection/transfer layer 116. Here, the light emitting layer 113 includes a p-type host and an n-type host, each with a HOMO/LUMO structure having a high hole injection and electron injection barrier. Such a structure may be similar to that of a PN junction in an LED, and current loss may be minimized by limiting a recombination zone within the two hosts. At this point, materials are required to have higher triplet energy than blue phosphorescent dopant and not too low hole mobility or electron mobility in addition to electrical/chemical/thermal stabilities. Here, if there is a material for a hole transfer layer or an electron transfer layer, which has high charge mobility and higher triplet energy than blue phosphorescent dopant, a high degree of freedom in designing a device structure may be provided.

The key to develop a phosphorescent white OLED device is to develop a new material having wide triplet energy. It is important to have wide triplet energy that maintains existing charge mobility and stability in a hole transfer layer and an electron transfer layer in addition to a host, and does not dissipate the triplet energy of a blue phosphorescent dopant. Furthermore, it is also important to reduce the number of dopants in order to obtain manufacturability. In order to obtain a wide color reproduction range, a dopant having narrow spectrum is preferably used as a dopant for display. In order to obtain a high color rendering index number with the small number of dopants, a dopant having wide spectrum is preferably used as a dopant for lighting. Accordingly, the development of an OLED material for lighting is required separated from that of an OLED material for display.

Furthermore, a hybrid white OLED is an element that replaces phosphorescence, which causes blue color issue in blue color phosphorescent white OLED device, with fluorescence. The hybrid while OLED may be classified into a triplet harvesting type and a direct recombination type.

Figure 4:
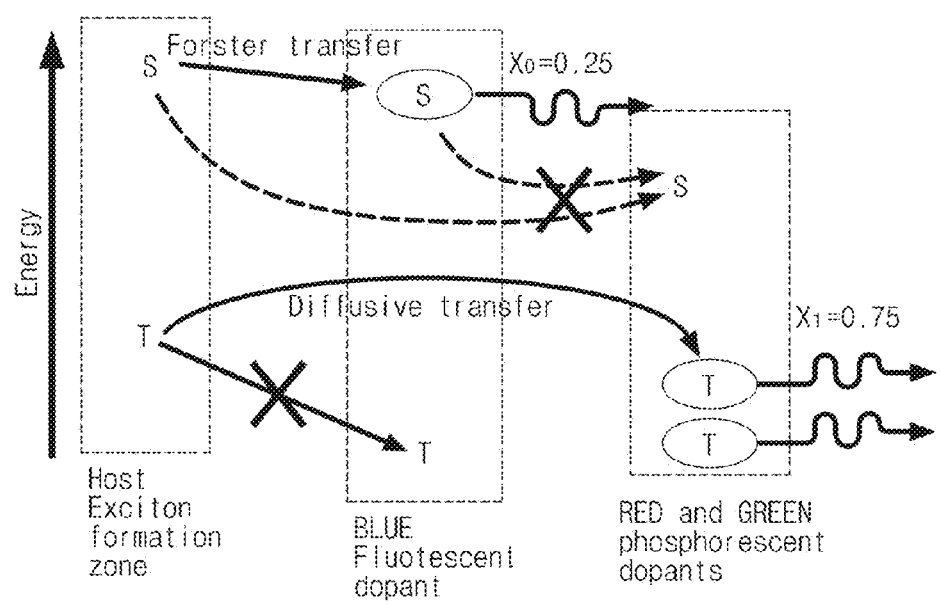
FIG. 4 is a schematic view illustrating an operating principle of a triplet harvesting type hybrid white OLED.

First, the triplet harvesting type is a very attractive method in that it can theoretically change all current into light energy. That is, since the triplet harvesting type could obtain efficiency and device stability like a phosphorescent white OLED, it has drawn much attention from researchers. In relation to the principle that such a type device operates, as shown in FIG. 4, which illustrates the operation principle of a triplet harvesting type hybrid white OLED, most of the recombination in a fluorescent layer, and accordingly, blue light emission is obtained by the singlet exciton of the fluorescent layer. A triplet, which is not used in the recombination zone of the fluorescent layer, transfers to a phosphorescent layer through diffusive transfer, thereby obtaining green and red phosphorescent emission. With such a principle, the singlet of about 25% is converted into the blue light emission of the fluorescent layer and the triplet of the remaining about 75% is converted into the green/red light of the phosphorescent layer, so that 100% conversion efficiency may be achieved.

The important issue in such a device is to control a recombination zone to be limited to the fluorescent layer, and adjust energy transfer in order to allow triplet excitons to occur only in the phosphorescent layer. Such a type hybrid device may not be substantially used due to demanding operational conditions. That is, since the triplet excitons of the fluorescent layer need to transfer to the phosphorescent layer to the maximum without loss, a path for that becomes extinct by a non light emitting process in the fluorescent layer, or becomes extinct after transferring from the phosphorescent layer to the fluorescent layer again. That is, extinct paths need to be considered. At this point, since information on conditions for generating a desired path faster than other extinct paths is insufficient, it is difficult to design and expect a device.

Figure 5:
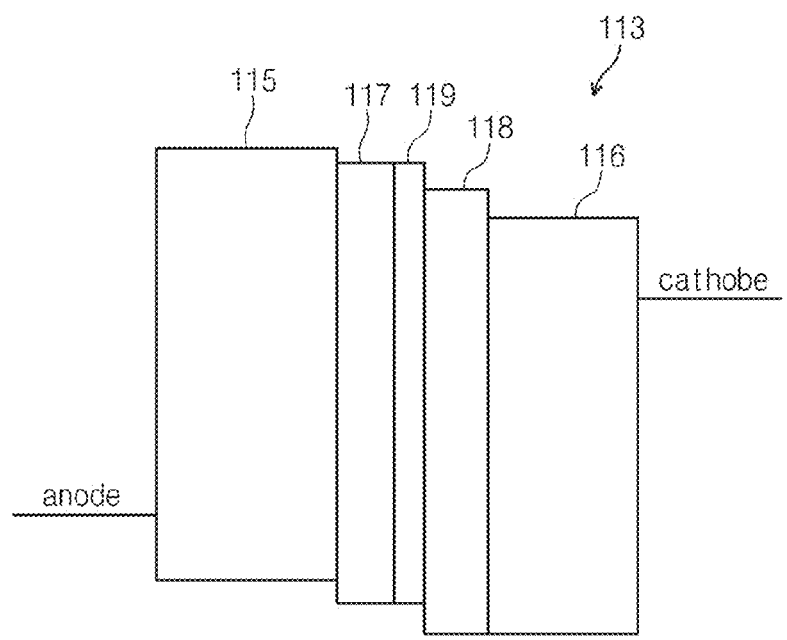
FIG. 5 is a schematic view illustrating a structure of a direct recombination type hybrid white OLED.

As shown in FIG. 5, which illustrates a direct recombination type hybrid white OLED structure, this type device uses a method through which light emission is obtained from both fluorescence and phosphorescence by forming a recombination zone in both the fluorescent layer 118 and the phosphorous layer 117 through adjustment. Since the triplet excitons of the blue fluorescent layer may not be used, efficiency may be lower compared to the above-mentioned triplet harvesting type. However, this type device may utilize a wide variety of materials and may have a structure having a high degree of freedom in designing a device. In this type device, the role of an interlayer 119 that separates a fluorescent layer from a phosphorescent layer is very important. That is, the interlayer 119 serves to adjust a recombination zone to be formed over a fluorescent layer and a phosphorescent layer, and also serves to prevent the triplet excitons of a phosphorescent layer from transferring to a fluorescent layer and becoming extinct.

As another challenge that needs to be overcome in an organic light emitting device such as the above-mentioned OLED, there is a light extraction issue.

As mentioned above, a material used for a light emitting layer in an OLED includes fluorescence and phosphorescence. Since a phosphorescent OLED may use all excitons, which are generated through recombination, for light emission, a theoretical internal quantum efficiency is 100%. That is, the efficiency is about four times than that of a fluorescent OLED, but the material has a short life cycle. However, due to the active development of phosphorescent materials, their internal quantum efficiency and life cycle are greatly improved, and thus, they are now used in commercial products. However, even if the internal quantum efficiency of an OLED is about 100%, only about 20% of the emission amount is emitted the external, about 80% thereof is lost due to a wave-guiding effect resulting from a refractive index difference between the substrate 111 and the ITO first electrode 112 and organic light emitting layer 113 and a total reflection effect resulting from a refractive index difference between the substrate 111 and air.

A refractive index of the organic light emitting layer 113 is about 1.6 to about 1.9, and a refractive index of ITO typically used as an anode is about 1.9 to about 2.0. Each of the above two layers have a thin thickness of about 100 nm to about 400 nm, and a refractive index of glass typically used as the substrate 111 is about 1.5. Thus, a planar waveguide is naturally formed. According to calculations, the light lost in an internal guided mode due to the above reason is about 45%. Additionally, since the refractive index of the substrate 111 is about 1.5 and the refractive index of air is about 1.0, the light incident at an angle greater than a critical angle is total-reflected when escaping from the substrate 111 to the external, and thus is tripped in a substrate inside. Since the light trapped therein is about 35%, only about 20% of the emission amount is emitted to the external.

Due to such a low light extraction efficiency, the external quantum efficiency of an OLED stays in a low level. Therefore, a light extraction technique becomes a core technology that improves the efficiency, brightness, and life cycle of an OLED lighting panel.

A technique for extracting the trapped light from an organic light emitting layer/ITO layer to the external through an interface between an anode (i.e. ITO) and a substrate is called internal light extraction, and a technique for extracting the trapped light from a substrate to the external (i.e. air) is called external light extraction.

In relation to the external light extraction, the improvement of realistic light efficiency is limited to about 1.6 times and color change according to a viewing angle, which results from diffraction phenomenon, needs to be minimized The external light extraction technique includes a method of forming a Micro Lens Array (MLA), an external scattering layer, and an anti-reflective film.

The internal light extraction technique may theoretically improves external light efficiency more than about three times, but affects an internal OLED interface very sensitively. Therefore, in addition to optical effect, electrical, mechanical, and chemical characteristics should be satisfied. The internal light extraction technique includes a method of forming an internal scattering layer, a substrate surface modification, a refractive index adjusting layer, a photonic crystal, and a nano structure.

Figure 6:
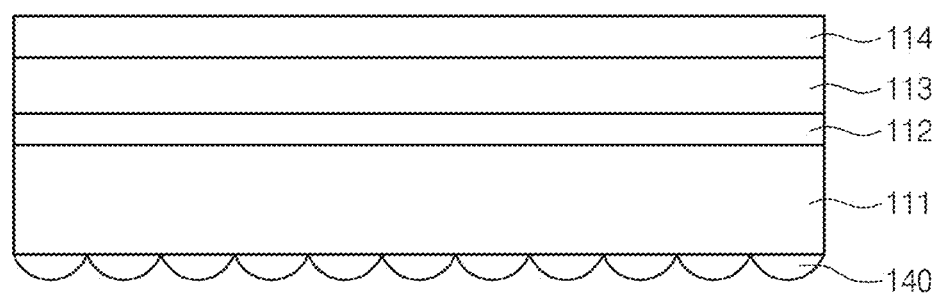
FIG. 6 is a schematic view illustrating a light extraction principle of a micro lens array.

In relation to the external light extraction, the MLA includes to a plurality of lenses, which are two-dimensionally disposed on a plane of a flat substrate that faces air. Each lens has a diameter of less than about 1 mm. As shown in FIG. 6, which illustrates a light extraction principle of the MLA, since an incident angle of light with respect to the surface tangent of the micro lens 140, which is curved than a plane, becomes less than a critical angle, the light is not trapped by total reflection and is extracted to the external. A medium of the MLA is made of a material having the same refractive index as the substrate 111 and has a diameter of several tens of μm. as the density of the micro lens 140 becomes higher, light extraction efficiency is increased, and according to the shape of a lens, light distribution is changed. When an external light extraction structure is attached to the substrate external by using the MLA, efficiency increase of about 50% is provided.

In the external light extraction, an external scattering layer may be manufactured in a sheet shape and then is attached to the substrate external through a similar method of forming an MLA sheet. Or, an external scattering layer may be manufactured by coating a substrate with a manufactured solution and hardening the coated substrate. Since there is no color change and interference color according to a viewing angle in the external scattering layer and Lambertian distribution is maintained after light passes through a light scattering layer, this light extraction structure may be applicable to a white OLED lighting panel. However, if a light scattering layer becomes thicker and light scattering particles form a multi layered structure, scattering effect of a short wavelength becomes greater than that of a long wavelength so that a transmission color has yellowish red. This should be taken care of. In order to minimize a spectrum change due to a scattering effect difference according to a wavelength, the refractive index, size, and density of scattering particles and also the refractive index and absorption spectrum of materials need to be adjusted. In an external fluorescent colloid structure, a ratio of the absorbed light to the scattering and re-emitting light may vary sensitively according to a thickness, a fluorescent size, and a concentration, so that it should be designed carefully. It may be effective to form a light scattering layer by using a polymer sheet containing small air bubbles. Since the refractive index of air bubble is about 1.0 and the refractive index of a material is about 1.5, there is a great refractive index difference, and thus, light scattering effect becomes larger. Therefore, it is advantageous to minimize spectrum change by relatively minimizing the thickness of a light scattering layer.

In the external light extraction, an anti-reflective film refers to a layer, which is formed by thinly stacking one-to-three layers of materials such as dielectic substances on the section of an optical device, in order to remove the light reflection due to a drastic refractive index change at the section of the optical device and increase the amount of transmitting light. When light reflection occurs two times (i.e. when the light is incident to a glass substrate and is transmitted through it), the light of about 8% is lost. In the OLED, because of a device structure, if light is emitted to the external air, one time reflection occurs. Thus, light extraction efficiency may be increased by about 4% when an anti-reflective film is used for external light extraction. When the minimum reflection of perpendicularly-incident light is required in relation to a single wavelength light, a material having a refractive index corresponding to the square root of a refractive index of a substrate for deposition is deposited with a thickness of the one-fourth wavelength of the material. However, if the minimum refractive index is required with respect to several wavelengths in a visible ray area, several layers of different materials may be deposited.

Figure 7:
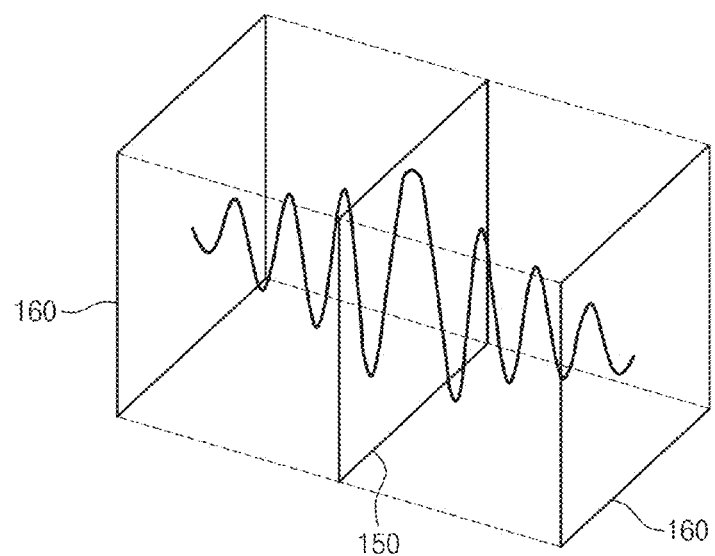
FIG. 7 is a schematic view illustrating a principle of a micro cavity using a bragg minor.

In the internal light extraction, a micro-resonator is also called micro-cavity. As shown in FIG. 7, which illustrates the principle of the micro-cavity using a Bragg mirror, a spacer layer 150 is disposed between the brag mirrors 160 or metal mirror layers in order to generate resonance.

Since the thickness of the spacer layer 150 has the size of a wavelength that generates standing waves of visible ray, the term "micro" is given. In the OLED, the micro-cavity includes a strong cavity and a weak cavity. The OLED includes a weak cavity structure without specially designing a cavity structure. As a basic structure, an organic light emitting layer having a refractive index of about 1.6 to about 1.9 is stacked at the center with a thickness of several hundreds of nm, and an ITO (for example, an anode) layer and metal cathode layer having a refractive index of about 1.9 are stacked at the both of the organic light emitting layer, so that a natural micro-cavity structure is formed. Therefore, light extraction efficiency varies greatly according to a thickness of an organic light emitting layer and a thickness of an ITO layer. Especially, as a relative position of a recombination zone changes, a ratio of a light extraction mode with respect to an internal/external guided mode changes from about 22% into about 55%.

Additionally, if the thickness of a cathode exceeds by λ/4 with respect to a wavelength λ of light, light extraction efficiency is decreased, so that it may be less than λ/4.

A tandem structure using an organic light emitting layer as a multi layered structure may use a micro-cavity structure variously, and thus, may be used in manufacturing a color modulation OLED panel. In relation to the micro-cavity structure, before each layer of an OLED device is deposited, a Bragg mirror layer is deposited through a similar deposition method, and each layer's thickness is adjusted. Therefore, there is no need to worry about surface abnormality due to a light extraction structure, and the micro-cavity structure is easily applicable to panel production. However, there is a big limitation in using the micro-cavity structure for the internal light extraction of an OLED lighting panel. That is, all micro-cavities necessarily accompany spectrum narrowing. As a strong micro-cavity structure is used more, spectrum narrowing becomes stronger, so that only the light in a very narrow wavelength area is emitted strongly. However, the light emitting efficiency of the light having a wavelength not in a corresponding wavelength area is reduced.

Accordingly, in the case of an OLED lighting panel using a white OLED device, when the micro-cavity structure is used, the light emission color of the panel may easily deviate from a white color range. Also, since light extraction efficiency is decreased in an area other than a specific wavelength area, total light extraction efficiency may be decreased. Micro-cavity effect may be applied to a display panel that emits each RGB color, or a single color OLED panel.

Photonic crystal in the internal light extraction refers to a structure, in which two materials having different dielectric constants are arranged in a nm scale in order to allow or prevent transmission according to the wavelength of light, thereby only transmitting or reflecting only the light of a specific wavelength. Herein, a prohibited wavelength zone is called a photonic band gap. Through this phenomenon, it is possible to manufacture an optical device that may change an optical path with almost no loss. The photonic crystal has three types including a one dimensional photonic crystal (which is called a Bragg grating), a two dimensional photonic crystal (where embossing projections are arranged on a plane periodically, and a three dimensional photonic crystal. The photonic crystal uses the diffraction of light. That is, when a photo crystal structure is disposed on a planar optical waveguide formed in an OLED inside in order to prevent the light from being transmitted in a plane direction, a prevention band is formed. Therefore, the light generated in an organic light emitting layer does not form a guided mode so that it is emitted to the external. Through this phenomenon, a two dimensional photonic crystal structure is formed in an OLED, thereby improving light extraction efficiency. However, the two dimensional photonic structure may be applied to a single color OLED but may increase the light extraction efficiency of a specific wavelength in an OLED lighting panel using a white OLED.

Since an internal scattering layer in the internal light extraction has no color change according to a viewing angle and Lambertian distribution occurs therein basically, uniform brightness is provided in a panel. Additionally, since a scattering layer is formed by mixing different types of materials and coating a glass substrate with the mixed material, its manufacturing processes are relatively simple. When the scattering layer is applied, light extraction efficiency is increased more compared to there is no light scattering layer. Moreover, less color changes according to a viewing angle and similar Lambertian distribution are provided. However, there should be sufficient scattering centers in order to maximize a scattering effect, but when there are too much scattering centers, since back scattering is also increased, the possibility that scattered light is absorbed in an organic light emitting layer is increased. Accordingly, only when scattering and internal absorption are optimized, light extraction efficiency is increased. However, this is the assumed case that there is no light absorption in the scattering layer. In most cases, when there is absorption in a scattering layer, the light efficiency increase due to light extraction effect is reduced due to the absorption of the scattering layer. Even if the absorbance of the scattering layer is less than about 0.1, light efficiency deterioration rather than light extraction effect occurs due to absorption. Therefore, in order to use the scattering layer as an internal light extraction structure, a thin thickness needs to be manufactured to have a visible ray absorption of less than about 0.1.

A nano embossing structure in the internal light extraction is a light extraction structure that takes only advantages of the above-mentioned photonic crystal and scattering layer. As described above, since the photonic crystal structure is used only for a specific wavelength band of light, it is unavailable for a white OLED. Also, since internal absorption occurs inevitably in the scattering layer, light extraction effect is reduced by half. In relation to the nano embossing structure, embossing structures of several hundreds of nm are used for an internal light extraction structure like the photonic crystal, but are arranged irregularly. The arranged nano embossing structures have diffraction effect partially, but serve as a single scattering layer. Therefore, light wavelength dependency, color change according to a viewing angle, and light distribution distortion disappear almost, and also, self absorption becomes almost negligible.

Figure 8:
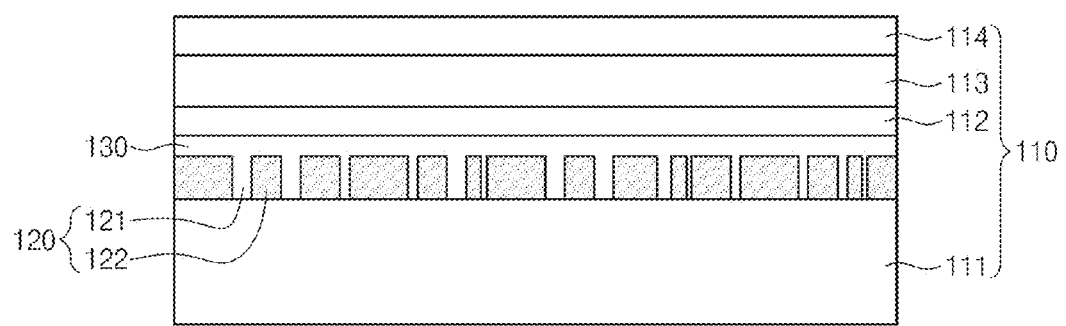
FIG. 8 is a schematic view illustrating an organic light emitting device that improves internal light extraction by applying a nano embossing structure.

FIG. 8 is a schematic view illustrating an organic light emitting device that improves internal light extraction by applying a nano embossing structure.

The organic light emitting device shown in FIG. 8 includes a light emitting part 110 (where a substrate 111, a first electrode 112, an organic light emitting layer 113, and a second electrode 114 are sequentially stacked), and an embossing layer 120 having a first opening part 121 (which is distributed between the substrate 111 and the first electrode 112).

The substrate 111, the first electrode 112, the organic light emitting layer 113, and the second electrode 114 are sequentially stacked. At this point, an additional layer for performing an additional function may be interposed between each layer. The first electrode 112 may be a transparent anode, and the second electrode 114 may be a reflective cathode. According to a type of an organic light emitting device, their positions may be opposite.

The embossing layer 120 corresponding to the above-mentioned nano embossing structure is distributed between the substrate 111 and the first electrode 112. As seen from the top, the embossing layer 120 has at least one first opening part 121. Thus, as seen from the side, the embossing layer 120 has an embossing part 122 and a dented part. At this point, the dented part corresponds to the first opening part 121, and in more detail, is a hole or a groove. If the first opening part 121 is a hole, the substrate 111 below the embossing layer 120 or an additional layer on the substrate 111 may be exposed by the hole. If the first opening part 121 is a groove, the substrate 111 or an additional layer on the substrate 111 is not exposed.

The first opening part 121 may be randomly distributed between the substrate 111 and the first electrode 112.

The embossing layer 120 that is randomly distributed between the substrate 111 and the first electrode 112 is formed through a metal dewetting phenomenon and a dry etching method such as reactive ion etching. Or, a metal dewetting phenomenon, and dry and wet etching methods are simultaneously used to form the embossing layer 120.

That is, an organic layer is applied on a substrate such as a glass substrate (or on an additional layer stacked on a substrate), and a metal layer is applied on the organic layer again. Then, a metal pattern of several tens to several hundreds of nm is formed by inducing a dewetting phenomenon of the metal layer through thermal treatment. The formed metal pattern serves as an etching mask for etching the organic layer. Then, when reactive ion etching is performed with oxygen plasma, the organic layer below the metal pattern remains and the other portions are etched so that the organic layer has the same pattern as the metal pattern. Next, an embossing layer formed of the organic layer is formed on the substrate by removing the metal pattern through acid solution.

The metal pattern may have various shapes by adjusting the thickness and material of the metal layer, a thermal treatment temperature, time, and atmosphere, the material of the organic layer, and surface treatment. That is, by adjusting the above conditions, the metal pattern may have a shape of water droplets, a porous metal layer, and an irregular combed shape.

Figure 9:
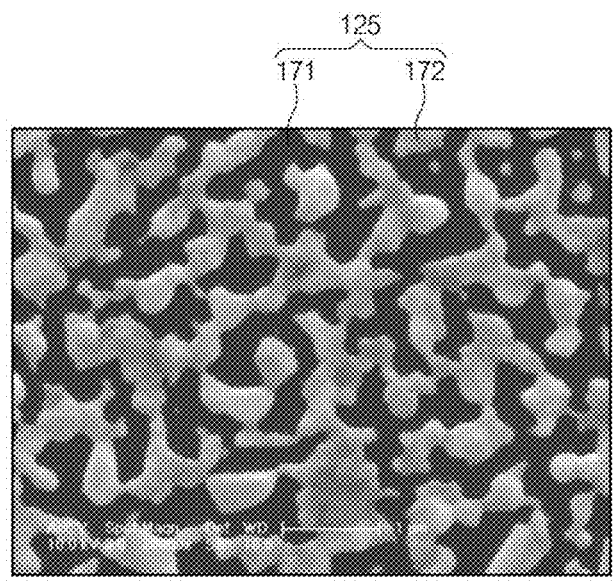
FIG. 9 is a schematic view illustrating a metal pattern formed through a dewetting phenomenon.

FIG. 9 is a SEM Image illustrating a metal pattern formed through a dewetting phenomenon.

On a soda lime glass substrate, a resin including polyimide is applied with a thickness of about 500 nm After a Ag—Pd alloy is deposited thereon with a thickness of about 50 nm, the result is heated in a vacuum oven for about 10 min at a temperature of about 300° C. Its result is the micrograph captured from the top as shown in FIG. 9.

It is observed that the Ag—Pd alloy, i.e. metal, gathers together through a dewetting phenomenon in order to form an embossing part 172, and the opening parts 171 having relatively less Ag—Pd alloy are randomly distributed.

The embossing part 122 of the embossing layer is formed at the position of the embossing part 172 of the metal, and the first opening part 121 of the embossing layer 120 is formed at the position of the opening part 171 of the metal. That is, by using as a mask the metal pattern 125 formed through a dewetting phenomenon, the embossing layer 120 having the first opening part 121 may be easily manufactured.

Thus, the embossing layer having the first opening part serves as a light scattering layer. Therefore, light wavelength dependency, color change according to a viewing angle, and light distribution distortion disappear almost through random distribution, and also, self absorption becomes almost negligible. Therefore, the light extraction of the light emitted from the first electrode to the substrate is improved through the embossing layer.

The above embossing layer 120 may have a visible ray absorption of less than about 10%. The reason is that light extraction efficiency is deteriorated when a visible ray absorption is high in the embossing layer 120.

Additionally, the embossing layer 120 may include at least one of polyimide, epoxy, polycarbonate, PVC, PVP, polyethylene, polyacrylamide, and perylene. At this point, the embossing layer 120 includes a compound having a material such as polyimide. In order to improve light extraction efficiency, refractive index of the embossing layer 120 is required to have the same as or less than that of the substrate. The embossing layer 120 may experimentally have a refractive index of about 1.3 to about 1.5. By forming an embossing layer with a polyimide of about 1.3 to about 1.5, the embossing layer having a desired refractive index may be obtained with high productivity.

The embossing part 122 of the embossing layer 120 has a width of about 100 nm to 1000 nm, and an interval between the embossing parts 122 of each embossing layer may be about 100 nm to about 3000 nm By setting the width and interval of the embossing part 122 of the embossing layer 120 as described above, it is confirmed that reliable light scattering is obtained.

Moreover, a planarization layer 130 may be additionally stacked to cover the embossing layer 120. The embossing layer 120 has a nano embossing structure, and thus, its cross section has an embossing shape. In this case, when a first electrode is stacked thereon, it also has an uneven section resulting from the embossing shape. Because of a very thin first electrode, organic light emitting layer, and second electrode, the uneven section may become a very important factor that causes a short circuit. Accordingly, the surface of the first electrodes is required to be flat, but when the first electrode of a transparent electrode material such as ITO is stacked on the embossing shape, its surface cannot be flat. Thus, the planarization layer 130 is inserted between the nano embossing structure and the first electrode.

In the embossing structure, the planarization layer 130 is required to be formed thickly on the dented parts and thinly on the embossing parts. The planarization layer may have a thickness of about 100 nm to about 2000 nm, a visible ray absorption of less than about 10%, and a surface roughness Ra of less than about 10 nm The thickness of the planarization layer is the height from the bottom of the dented part of the embossing layer to the opposite side of the planarization layer, for example.

Additionally, at least one of an MLA, a micro embossing pattern layer, a light scattering layer, and an anti-reflective coating layer may be further formed on the substrate 111. An external extraction part may be formed on the opposite surface of the substrate 111 where the first electrode, the organic light emitting layer, and the second electrode are stacked.

As a specific method of forming an MLA, after an MLA is formed on a film having a similar refractive index to a substrate, the film is attached to the substrate external surface, or after the substrate external surface is patterned, an MAL shape is directly etched.

If an embossing pattern having a proper width, height, and interval is formed on the substrate external surface, an effect similar to MLA may be obtained. The shape of an embossing pattern may include a pyramid shape, a pillar shape, a wavy shape, and other irregular shapes. Like the MLA, a specific method of forming an embossing pattern may include attaching the film having embossing patterns on a substrate, or directly etching a substrate.

When a light scattering layer is formed on the substrate external surface, the light incident to the interface between the substrate and external air is not totally reflected, and is scattered in all directions, so that the amount of light emitted to the external is increased. At this point, the light scattering layer is required to include both a material having a high refractive index and a material having a low refractive index. The material having a high refractive index may become a base and the material having a low refractive index may become scattering particles. A refractive index of a base material may be similar to or slightly higher than that of a substrate.

Anti-reflective coating may use a single thin layer or a multi-layered layer. If the anti-reflective coating is applied to the surface external side of the organic light emitting device according to the present invention, light extraction efficiency may be further improved.

That is, if both an internal light extraction method using an embossing layer and an external light extraction method using an MLA are used simultaneously, the light efficiency of an organic light emitting device may be improved.

Hereinafter, the planarization layer is described in more detail.

Figure 10:
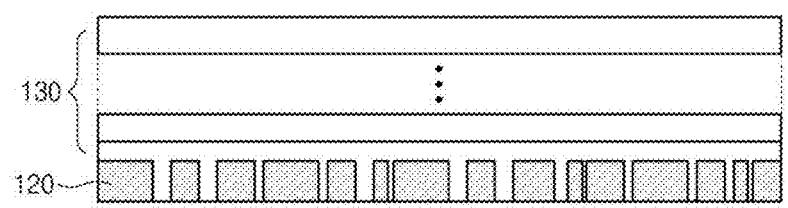
FIG. 10 is a schematic view illustrating an organic light emitting diode according to an embodiment of the present invention.

FIG. 10 is a schematic view illustrating an organic light emitting device according to an embodiment of the present invention.

The organic light emitting device of FIG. 10 includes an embossing layer 120 that increases the internal light extraction efficiency of the light emitted from an organic light emitting layer and a planarization layer 130 that is multiply stacked on the embossing layer 120.

For example, in the organic light emitting device of FIG. 8, the light generated from the organic light emitting layer 113 may be reflected at a cathode (i.e. the second electrode 114) or may be emitted toward an anode (i.e. the first electrode 112). At this point, in order to prevent the emitted light from being reflected at the interface due to a refractive index difference of each element that constitutes the organic light emitting device, the embossing layer 120 is used. Through this, light extraction efficiency may be improved as mentioned above.

However, the following issues should be prepared by disposing the embossing layer 120.

The organic light emitting layer 113 is formed with a very thin thickness of server tens of nm to several hundreds of nm. At this point, if there is an embossing part or a sharp spike of several tens of nm on the first electrode, for example, the surface of an anode, which is stacked below the organic light emitting layer, current is concentrated on that areas so that leakage current is increased. Due to this, luminous efficiency is deteriorated, and large current flows at a narrow portion, a short circuit occurs, and thus, a lifetime is shortened.

Since the embossing layer 120 itself has a section of an embossing structure, if a first electrode is stacked on the embossing layer 120, the first electrode is compelled to have the embossing structure.

In order to prevent such an issue, instead of directly stacking the first electrode on the embossing layer, the planarization layer 130 is stacked on the embossing layer 120, and then, the first electrode is stacked on the planarization layer 130.

Conditions required for the planarization layer 130 are as follows.

1. It should have a higher or same refractive index than the first electrode
2. It should be transparent in a visible light range.
3. It should cover the rough surface of the embossing layer 120 and its top surface should be flat and very smooth.
4. Adhesion to the embossing layer 120 below should be excellent
5. Adhesion to the first electrode should be excellent
6. It should be stable during subsequent processes.

Only one planarization layer may not satisfy the above conditions.

As mentioned above, a surface roughness Ra of the planarization may be less than about 10 nm. In order to make a surface roughness Ra less than about 10 nm, an average size of particles constituting the planarization layer should be less than about 10 nm. However, if a particle of less than about 10 nm is used to form the planarization layer, adhesion to the embossing layer 120 is reduced and thus, cracks occur.

For example, the planarization layer may be formed after applying colloidal sol on the embossing layer 120 and then drying it. If a particle size is less than about 10 nm, a solid content of the colloidal solution becomes smaller and shrinkage becomes larger during drying. Thus, adhesion is reduced.

If a size of a particle constituting the planarization layer is greater than about 10 nm, adhesion to the embossing layer 120 is improved, but the roughness of the top surface is over about 10 nm. As a result, the first electrode stacked on the planarization layer has embossing parts. That is, the degree of roughness required for the planarization layer may not be satisfied.

In order to resolve such an issue, multiple planarization layers 130 may be stacked as shown in FIG. 10.

At this point, the multiple planarization layers are required to satisfy the following conditions.

First, in order to satisfy the requirements of the planarization layer, the surface roughness (Ra) of each adjacent planarization layer in the multiple planarization layers may the same or may be lower as it becomes farther from the embossing layer 120. By such a configuration, strong adhesion to the embossing layer 120 may be provided and the surface roughness may be reduced to a desired level.

Additionally, a refractive index of each adjacent planarization layer in the multiple planarization layers may be the same between about 1.8 about to about 2.5. Or, as it becomes farther from the embossing layer 120, (i.e. as it becomes closer to the organic light emitting layer), a refractive index of each planarization layer becomes lower. The same refractive index of each planarization layer is desirable. However, a desired result may also be obtained when a refractive index of the planarization layer becomes lower as it becomes closer to the organic light emitting layer.

Since an anode (of ITO), i.e. the first electrode, has a refractive index of about 1.9 to about 2.0, it is expected that a refractive index of the planarization layer is greater than about 1.9. According to an experimental result, light extraction efficiency is increased at a refractive index of about 1.8. Although the planarization layer has a smaller refractive index than the anode layer, their difference is not so great, so that some of the guided modes spread into the planarization layer, and then, are scattered by an embossing structure at the bottom.

Figure 11:
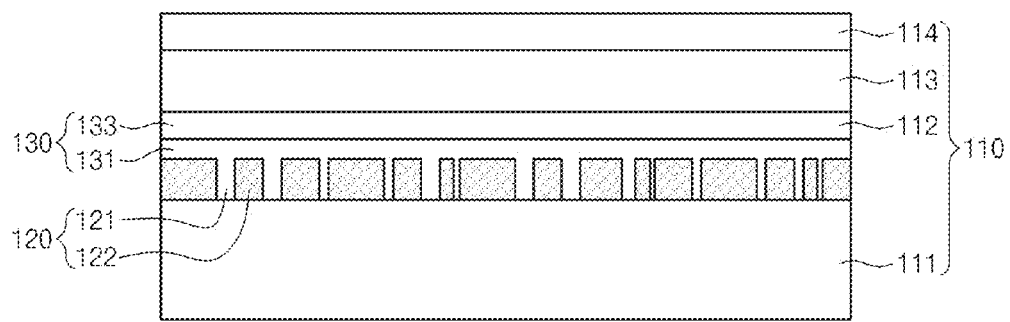
FIG. 11 is a schematic view illustrating an organic light emitting device according to another embodiment of the present invention.

FIG. 11 is a schematic view illustrating an organic light emitting device according to another embodiment of the present invention.

The organic light emitting device of FIG. 11 includes an embossing layer 120 on a substrate 111 and a planarization layer 130 having a first planarization layer 131 and a second planarization layer 133.

The first planarization layer 131 is stacked on the embossing layer 120, and its surface roughness (Ra) ranges from about 10 nm to about 50 nm The first planarization layer 131 has an average size of particles ranging from about 10 nm to about 50 nm, and is formed by applying an inorganic colloidal sol and baking it. The resultant film may have a refractive index of about 1.8 to about 2.5.

The first planarization layer 131 includes at least one of metal oxide, metal sulfide, and metal nitride. The metal oxide may include at least one of $TiO_2$, $ZnO$, $SnO_2$, $In_2O_3$, and $In_2O_3$—$SnO_2$. The metal sulfide may include ZnS. The metal nitride may include silicon nitride.

By such a material, the first planarization layer 131 may provide reliable adhesion to the embossing layer 120 and the substrate 111. Moreover, the first planarization layer 131 is transparent in a visible light, and is stable during subsequent processes. Furthermore, the first planarization layer 131 covers the rough surface of the embossing layer 120 reliably.

The second planarization layer 133 is stacked on the first planarization layer 131, and its surface roughness is less than about 10 nm The second planarization layer 133 may include a polycrystal or an amorphous substance, whose average size of particles is less than about 10 nm. An organic/inorganic hybrid solution may include inorganic colloidal sol and polymer mixture, and a solution including inorganic colloidal particles and organic materials. The organic/inorganic hybrid solution may be applied, and then, dried and baked in order to form the second planarization layer 133.

Polycrystal is a set of small single crystals having different orientations. Polycrystal is crystals on the small area. Crystals may refer to the orderly arrangement of molecules. If this orderly arrangement is uniformly distributed over a solid, it is called single crystal. However, when crystals are formed on several portions but one uniform crystal is not formed overall, it is called polycrystal. When crystals grow on different portions simultaneously, they have different orientations and merge together during the growth, so that they cannot be a big single crystal. When most of the metal and ceramic materials are manufactured, melting liquid is rapidly cooled. As a result, numerous fine single crystals are suddenly formed to become polycrystal. In many cases, spectroscopy uses polycrystalline samples, and spectrum may vary according to the orientations of molecules. Accordingly, polycrystal spectrum is the sum of all-direction single crystal spectrums.

Unlike crystal, an amorphous substance has no regularity of atomic arrangement. Its example includes inorganic glass, natural rubber, natural resin, synthetic rubber, and plastic. An amorphous substance may be also called a non-crystalline substance. A solid is largely classified into a crystalline substance and an amorphous substance according to an internal structure. The crystalline substance has a periodic regularity of the arrangement of atoms and molecules but the amorphous substance typically lacks such a regularity of the arrangement. The crystalline substance has a shape in which its outer appearance is surrounded by crystal faces, but the amorphous substance has a uniform shape. Unlike the crystalline substance, the amorphous substance has no melting point, and is slowly softened as a temperature becomes high in order to continuously become liquid. Between the states, especially in the case of polymer, it shows mechanical properties having viscosity and elasticity.

The second planarization layer 133 may include at least one of metal oxide, metal sulfide, metal nitride, organic/inorganic hybrid material, and a nano composite.

At this point, the metal oxide may include at least one of $TiO_2$, $ZnO$, $SnO_2$, $In_2O_3$, and $In_2O_3$—$SnO_2$. The metal sulfide may include $ZnS$. The metal nitride may include silicon nitride. The organic/inorganic hybrid material may include a mixture of the metal oxide and at least one of polyvinyl phenol resin, epoxy resin, polyimide resin, poly-styrene resin, polycarbonate resin, polyethylene resin, PMMA resin, polypropylene resin, and silicon resin as organic matter. In the nano composite, a metal oxide having a particle of less than about 10 nm may be distributed in the above-mentioned organic material.

According to the above material, the second planarization layer 133 may provide reliable adhesion to the first electrode. Additionally, the second planarization layer 133 is transparent in a visible light range, and is stable during subsequent processes. Furthermore, the second planarization layer 133 on which the first electrode is stacked has a desired flat and smooth surface.

The first electrode, i.e. an electrode layer such as an anode, may be interposed between the organic light emitting layer and the planarization layer, and may have a refractive index of about 1.9 to about 2.0.

By such a configuration, the light extraction efficiency of an organic light emitting device (where a substrate, an embossing layer, a multiple planarization layers, an electrode layer, and an organic light emitting layer are sequentially stacked) may be improved, and its leakage current may be reduced to improve reliability. The reliability of an organic light emitting device provides a desired lifetime, and prevents an abnormal change with the passage of time.

As described above, an organic light emitting device of the present invention improves internal light extraction efficiency through an embossing layer and a multiple planarization layer improving the surface roughness simultaneously on the embossing layer.

Thus, an electrode layer is stacked evenly on the multiple planarization layers and it results in low leakage current of an organic light emitting device to improve reliability. As a result, an organic light emitting device improved light extraction efficiency, leakage current, and reliability is provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting device, comprising:
   a substrate;
   an embossing layer provided on the substrate that is comprised of at least one of a polycarbonate, a PVC, a PVP, a polyethylene, and a perylene;
   and having a refractive index ranging from about 1.3 to about 1.5;
   a planarization layer provided on the embossing layer and having a refractive index that ranges from about 1.8 to about 2.5;
   a first electrode provided on the planarization layer;
   an organic light emitting layer provided on the first electrode; and
   a second electrode provided on the organic light emitting layer;
   wherein the planarization layer has a refractive index that becomes lower as it is progressively farther from the embossing layer.

2. The organic light emitting device of claim 1, wherein the first electrode has a refractive index ranging from about 1.9 to about 2.0.

3. An organic light emitting device, comprising:
   a substrate;
   an embossing layer provided on the substrate and having a refractive index ranging from about 1.3 to about 1.5;
   a planarization layer comprised of:
      a first planarization layer provided on the embossing layer and having a surface roughness of about 10 nm to about 50 nm and a refractive index that ranges from about 1.8 to about 2.5; and
      a second planarization layer provided on the first planarization layer and having a surface roughness of less than about 10 nm;
   a first electrode provided on the second planarization layer;
   an organic light emitting layer provided on-the first electrode; and
   a second electrode provided on the organic light emitting layer.

4. The organic light emitting device of claim 3, wherein the first planarization layer comprises at least one of a metal oxide, a metal sulfide, and a metal nitride.

5. The organic light emitting device of claim 4, wherein the metal oxide comprises at least one of $TiO_2$, $ZnO$, $SnO_2$, In$_2$O$_3$, and In$_2$O$_3$—SnO$_2$; the metal sulfide comprises ZnS; and the metal nitride comprises silicon nitride.

6. The organic light emitting device of claim 3, wherein the second planarization layer comprises a material that is a polycrystalline material or an amorphous material, and has an average particle size that is less than about 10 nm.

7. The organic light emitting device of claim 3, wherein the second planarization layer comprises at least one of a metal oxide, a metal sulfide, a metal nitride, an organic/inorganic hybrid material, and a nano composite material.

8. The organic light emitting device of claim 7, wherein the organic/inorganic hybrid material comprises a mixture of the metal oxide and at least one of a polyvinyl phenol resin, an epoxy resin, a polyimide resin, a poly-styrene resin, a polycarbonate resin, a polyethylene resin, a PMMA resin, a polypropylene resin, and a silicon resin as organic matter.

9. The organic light emitting device of claim 7, wherein the metal oxide comprises at least one of TiO$_2$, ZnO, SnO$_2$, In$_2$O$_3$, and In$_2$O$_3$—SnO$_2$; the metal sulfide comprises ZnS; and the metal nitride comprises silicon nitride.

10. The organic light emitting device of claim 3, wherein the planarization layer has a refractive index that becomes lower as it is progressively farther from the embossing layer.

11. The organic light emitting device of claim 3, wherein the first electrode has a refractive index ranging from about 1.9 to about 2.0.

12. An organic light emitting device, comprising:
a substrate;
an embossing layer provided on the substrate that has an embossing part and an opening part;
a planarization layer comprised of:
 a first planarization layer provided on and in direct contact with the embossing layer, and filling the opening part of the embossing layer; and
 a second planarization layer provided on and in direct contact with the first planarization layer and having a surface roughness that is less than that of the first planarization layer;
a first electrode provided on the second planarization layer;
an organic light emitting layer on the first electrode; and
a second electrode provided on the organic light emitting layer.

\* \* \* \* \*